(12) United States Patent
Park et al.

(10) Patent No.: US 8,828,251 B2
(45) Date of Patent: Sep. 9, 2014

(54) METHOD FOR FINISHING EXTERIOR SURFACE OF INJECTION-MOLDED PRODUCT

(75) Inventors: Jong-Bae Park, Gyeongsangbuk-do (KR); Pil-Woo Lee, Gyeongsangbuk-do (KR); Jong-Hwa Kim, Gyeongsangbuk-do (KR); Hak-Ju Kim, Gyeonggi-do (KR); Jung-Won Cho, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 155 days.

(21) Appl. No.: 13/115,195

(22) Filed: May 25, 2011

(65) Prior Publication Data

US 2012/0055902 A1 Mar. 8, 2012

(30) Foreign Application Priority Data

Sep. 7, 2010 (KR) ........................ 10-2010-0087363

(51) Int. Cl.
*C03C 15/00* (2006.01)
*B32B 5/16* (2006.01)
*G03F 7/00* (2006.01)

(52) U.S. Cl.
CPC ...................................... *G03F 7/00* (2013.01)
USPC ........ 216/41; 216/2; 216/28; 216/32; 216/39; 216/83; 216/95; 216/96; 428/35.7; 428/35.8; 428/187; 428/203; 428/206; 428/327

(58) Field of Classification Search
CPC ............ B05D 5/067; B05D 7/52; B05D 7/53; B32B 27/00; C23C 16/56; C23C 4/02; G03F 7/00
USPC .......................... 216/2, 32, 39, 41, 83, 95, 96
See application file for complete search history.

(56) References Cited

U.S. PATENT DOCUMENTS

| | | | | |
|---|---|---|---|---|
| 5,320,869 A * | 6/1994 | Eisfeller et al. | | 427/250 |
| 7,144,685 B2 * | 12/2006 | Mizutani et al. | | 430/311 |
| 7,989,154 B2 * | 8/2011 | Jeon et al. | | 430/322 |
| 8,202,592 B2 * | 6/2012 | Hsu et al. | | 428/35.7 |
| 8,624,125 B2 * | 1/2014 | Shimokawa et al. | | 174/255 |
| 2003/0190485 A1 * | 10/2003 | Takatsuki et al. | | 428/458 |
| 2006/0019088 A1 * | 1/2006 | Wang et al. | | 428/327 |
| 2008/0264903 A1 * | 10/2008 | Anton et al. | | 216/48 |
| 2009/0317595 A1 * | 12/2009 | Brehm et al. | | 428/172 |
| 2010/0098890 A1 * | 4/2010 | Hou et al. | | 428/35.9 |
| 2010/0119842 A1 * | 5/2010 | Hwang et al. | | 428/425.8 |
| 2010/0176090 A1 * | 7/2010 | Lochtman et al. | | 216/95 |
| 2011/0020613 A1 * | 1/2011 | Kim et al. | | 428/187 |
| 2011/0250400 A1 * | 10/2011 | Lee et al. | | 428/161 |
| 2012/0295045 A1 * | 11/2012 | Tang et al. | | 428/35.7 |
| 2013/0216852 A1 * | 8/2013 | Hsu et al. | | 428/596 |

* cited by examiner

*Primary Examiner* — Nadine Norton
*Assistant Examiner* — Christopher Remavege
(74) *Attorney, Agent, or Firm* — Cha & Reiter, LLC

(57) ABSTRACT

A method for finishing an exterior surface of an injection-molded product is provided, in which a metal layer is formed on the exterior surface of the injection-molded product, a photoresist layer is formed on the metal layer, a photomask is placed on the photoresist layer, light is projected onto the photomask, and remaining parts of the metal layer and the photoresist layer except for parts corresponding to a pattern formed on the photomask are removed by etching.

9 Claims, 3 Drawing Sheets

METHOD FOR FINISHING EXTERIOR SURFACE OF INJECTION-MOLDED PRODUCT

CLAIM OF PRIORITY

This application claims priority under 35 U.S.C. §119 to a Korean Patent Application filed in the Korean Intellectual Property Office on Sep. 7, 2010 and assigned Serial No. 10-2010-0087363, the contents of which are incorporated herein by reference.

BACKGROUND OF THE INVENTION

1. Field of the Invention

The present invention relates to an injection-molded product, and more particularly, to a surface finishing method for forming a symbol or logo on the exterior surface of an injection-molded product such as the case of a portable terminal, a cosmetics vessel, etc.

2. Description of the Related Art

An injection-molded product is a synthetic resin article fabricated into the shape of a metal mold by injecting melted resin into the metal mold and then hardening the injected resin. Owing to the easiness of mass production, injection molding is widely used in fabricating cases for daily used products, home appliances, electronic devices, etc.

Particularly, injection-molded products are used for cosmetics vessels, gaming consoles, portable terminals such as mobile phones, etc. These portable articles are now are must have fashion-items. Many portable terminal users additionally purchase portable pouches or decorate their terminals with attachable cases.

To meet such various user demands, efforts have been expended to diversify the exterior cases of portable articles. For example, visual effects are given by coloring products differently, applying paint that gradually changes color, or embedding patterns into the surfaces of the products. Especially, the symbols or logos of manufacturers are printed onto mobile communication terminals.

To this end, a pattern is formed on the exterior surface of an injection-molded product by an additional film or printing process, to provide new visual effects to a portable product.

However, the conventional film or printing process is not effective in ensuring the durability of a pattern on the exterior surface of an injection-molding product. This is because pattern can be faded and damaged due to frequent exposure to an external environment or impacts from frequent drops. Moreover, with the use of ink for attaching a film or painting, a product may be colored but lacks the polishing effect. Therefore, there are limitations on enhancing the appearance of the product.

SUMMARY OF THE INVENTION

An aspect of embodiments of the present invention is to address at least the problems and/or disadvantages and to provide at least the advantages described below. Accordingly, an aspect of embodiments of the present invention is to provide a surface finishing method for visually enhancing the appearance of an injection-molded product by giving a color and a metallic polish appearance to the injection-molded product through pattern formation.

In accordance with an embodiment of the present invention, a method for finishing an exterior surface of an injection-molded product, in which a metal layer is formed on the exterior surface of the injection-molded product includes forming a photoresist layer on the metal layer, placing a photomask on the photoresist layer, then light is projected onto the photomask, wherein remaining parts of the metal layer and the photoresist layer except for parts corresponding to a pattern formed on the photomask are removed by etching.

In the embodiment, the metal layer may be formed by depositing one of tin, silicon, aluminum and an alloy containing at least one of tin, silicon and aluminum on the exterior surface of the injection-molded product. A primer coating layer may be formed on the exterior surface of the injection-molded product, before the metal layer is formed. A clear coating layer may be formed on the exterior surface of the injection-molded product, after the etching. A base coating layer may be formed on the exterior surface of the injection-molded product, after the etching and a clear coating layer may be formed on the exterior surface of the injection-molded product, after the base coating layer is formed. Further, during the etching, removing a light-exposed part or non-light-exposed of the photoresist layer may be removed.

BRIEF DESCRIPTION OF THE DRAWINGS

The above features and advantages of certain embodiments of the present invention will be more apparent from the following detailed description taken in conjunction with the accompanying drawings, in which.

Throughout the drawings, the same drawing reference numerals will be understood to refer to the same elements, features and structures.

DETAILED DESCRIPTION OF THE INVENTION

Reference will now be made in detail to the preferred embodiments of the present invention with reference to the accompanying drawings. Also, wherever possible, the same reference numbers will be used throughout the drawings and the specification to refer to the same or like parts.

In the inventive method of finishing the exterior surface of an injection-molded product according to the teachings of the present invention, a metal layer is formed on the exterior surface of the injection-molded product, a photoresist layer on the metal layer is partially exposed, the exposed (or non-exposed) part is removed, and then the metal layer is etched into a pattern corresponding to the exposed part. The metal layer is preferably formed by deposition. In addition, after the metal layer is etched into the pattern, a clear coating layer is preferably formed on the exterior surface of the injection-molded product.

Figure 1:
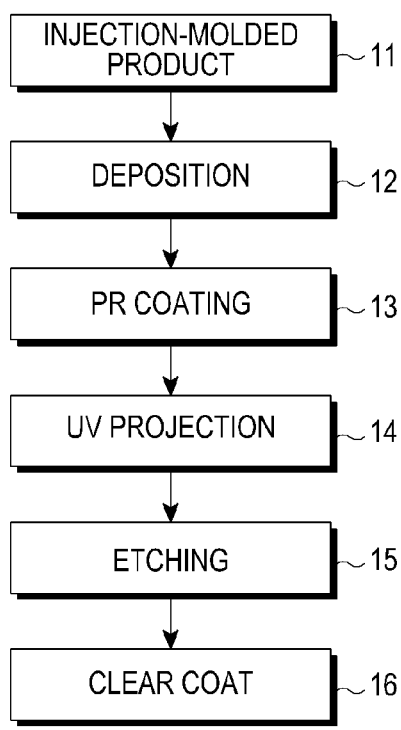
FIG. 1 is a flowchart illustrating a method for finishing the exterior surface of an injection-molded product according to an embodiment of the present invention.

FIG. 1 is a flowchart illustrating a method for finishing the exterior surface of an injection-molded product according to an embodiment of the present invention.

As shown, the inventive method 10 includes step 12 for forming a metal layer on an injection-molded product 11, step 13 for forming a photoresist layer, step 14 for exposing the photoresist layer to UltraViolet (UV) light, and step 15 for etching the metal layer.

The injection-molded product 11 is preliminarily fabricated into a predetermined shape by injecting melted resin into a metal mold and hardening the injected resin, for use as the case of a portable terminal, a cosmetics vessel, or the exterior of a home appliance. It will be clearly understood to those skilled in the art that according to the specification of a product to which the injection-molded product 11 is applied, the shape and color of the injection-molded product 11 may vary.

Figure 5:
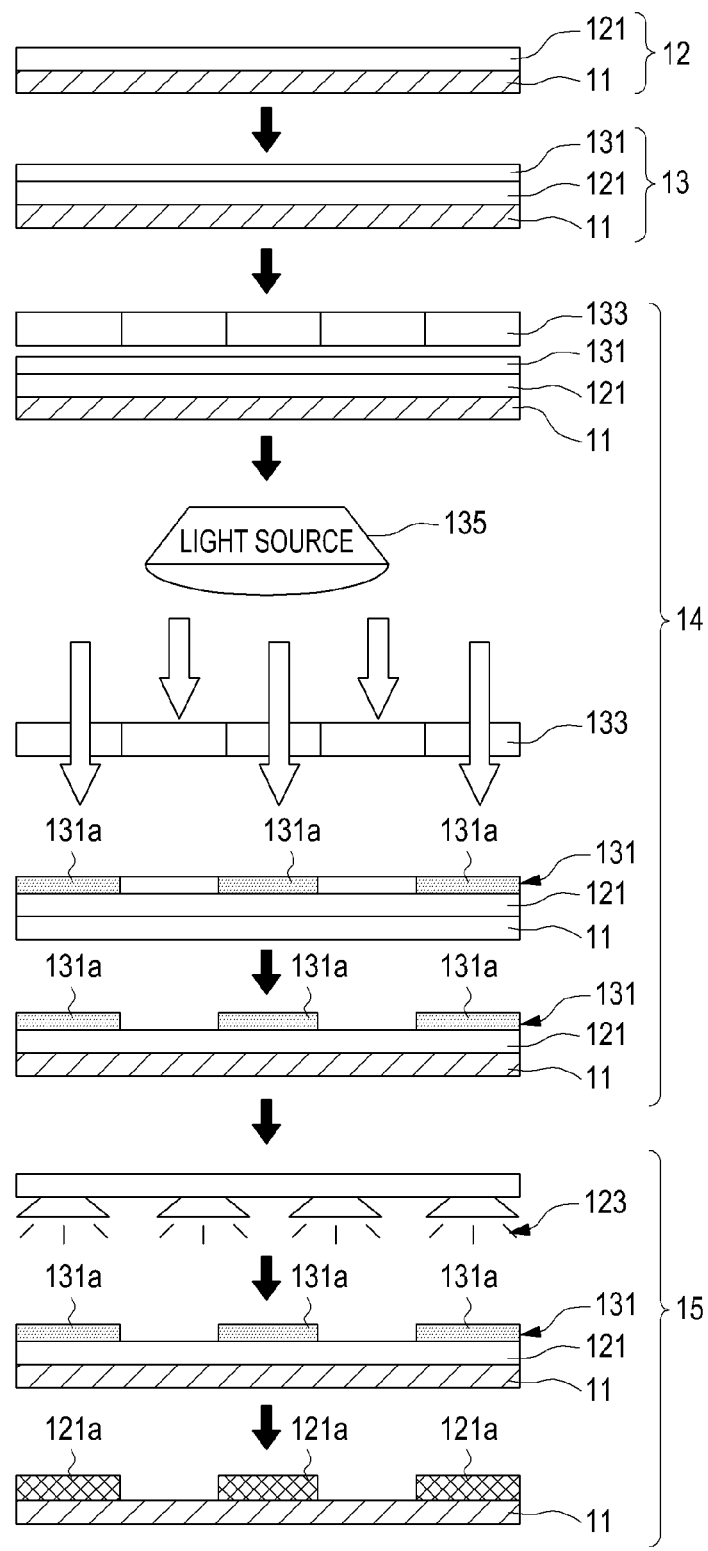
FIG. 5 sequentially illustrates an operation for forming a pattern onto the exterior surface of an injection-molded object in the methods for finishing the exterior surface of an injection-molded product according to the embodiments of the present invention.

With reference to FIG. 5, the embodiment of the present invention will be described in detail hereinafter.

In step 12, a metal layer 121 is formed on the exterior surface of the injection-molded product 11. The metal layer 121 may be formed over the exterior surface of the injection-molded product 11. If only the logo of a manufacturer is to be formed, the metal layer 121 may be formed only on a part of the exterior surface of the injection-molded product 11.

The metal layer 121 may be formed by depositing one of tin, silicon and aluminum or an alloy containing at least one of tin, silicon and aluminum. Since the metal layer 121 is formed by deposition of a metallic material, it may provide metallic polish effect to the injection-molded product 11 and thus contribute to enhancing the appearance of the injection-molded product 11. While it has been described that the metal layer 121 is formed through deposition in this embodiment, it may be further contemplated that the metal layer 121 is formed by plating the exterior surface of the injection-molded product 11 or painting the exterior surface of the injection-molded product 11 with metallic silver pigment. In other words, the metal layer 121 may be formed in any manner as far as it is suitable for the surface finishing method of the present invention in which a final pattern is formed on the exterior surface of the injection-molded product 11 using the metal layer 121 after photoresist coating, exposure, and etching. The metal layer 121 may be formed by one of various methods including deposition, plating, and painting.

In step 13, a photoresist layer 131 is formed by coating photoresist on the metal layer 121. Photoresist is a polymolecular material whose properties change when it is exposed to light. According to its composition, only the exposed or non-exposed part of the photoresist is easily solved in a solvent.

In step 14, a photomask 133 is placed on the photoresist layer 131 and light is projected onto the photoresist layer 131. A pattern to be formed on the injection-molded product 11 is also formed on the photomask 133. The photomask 133 is configured so that light is projected onto the photoresist layer 131 only through the pattern to be formed on the injection-molded product in FIG. 5, by way of example. Light-projected parts 131a of the photoresist layer 131 are not solved in a solvent, while only the remaining part of the photoresist layer 131 is solved in the solvent. A light source 135 for emitting light according to the composition of the photoresist layer 131 is selected. In other words, the light source 135 that emits light at a wavelength capable of changing the properties of the photoresist layer 131, for example, UV light or radioactive rays is installed and projects light onto the photoresist layer 131 through the photomask 133.

Preferably, the non-exposed part of the photoresist layer 131 is removed using the solvent after light is projected onto the photoresist layer 131 in step 14. As stated before, while the non-exposed part of the photoresist layer 131 is removed using a solvent in FIG. 5, it is purely exemplary. Thus, it will be easily understood to those skilled in the art that the exposed parts 131a of the photoresist layer 131 can be removed using a solved according to the composition of the photoresist layer 131.

Thus, the metal layer 121 deposited on the injection-molded product in step 12 is still kept and only the parts 131a corresponding to the pattern formed on the photomasks 133 remain in the photoresist layer 131.

In step 15, an etching solution 123 is sprayed onto the surface of the injection-molded product 11 after the etching step 14. The etching solution 123 corrodes away the metal layer 121. As described before, the parts 131a of the photoresist layer 131 corresponding to the pattern to be formed on the exterior of the product or a manufacturer logo (also referred to as a pattern) still remain on the metal layer 121. Therefore, the remainder of the metal layer 121 except parts 121a of the metal layer 121 corresponding to the parts 131a of the photoresist layer 131 is removed. Although it is preferred to remove the parts 131a of the photoresist layer 131 too in step 15, the parts 131a of the photoresist layer 131 may be removed after the etching step in order to ensure clear formation of the pattern of the metal layer 121.

After the photoresist layer 131 is completely removed and the intended pattern is formed only with the metal layer 121 in step 15, a clear coating layer (not shown) is preferably formed on the surface of the injection-molded product 11 in step 16. The clear coating layer is formed by coating a coating solution whose main component is acrylic resin onto the exterior surface of the injection-molded product 11. The clear coating layer serves as a transparent and polishing hardening protection layer. Thus, the metal layer 121 is formed into the pattern on the exterior surface of the injection-molded product 11 and the clear coating layer gives a polish to the exterior surface of the injection-molded product 11.

Meanwhile, it is preferred to remove foreign materials remaining on the exterior surface of the injection-molded product 11 by cleaning after the etching step 15, before the clear coating layer is formed in step 16.

Figure 2:
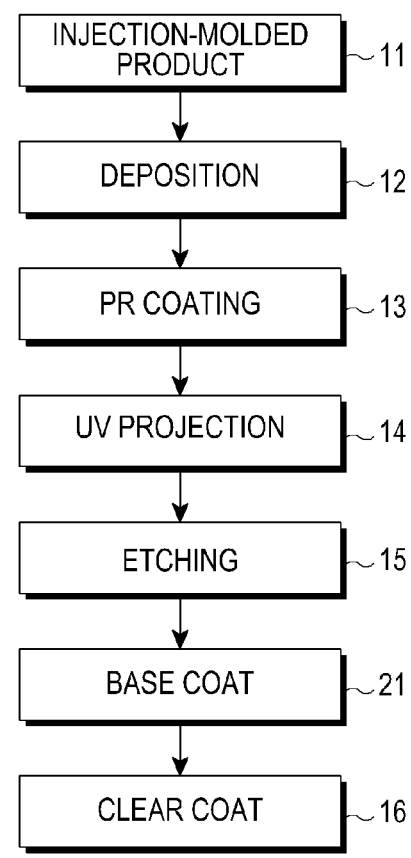
FIG. 2 is a flowchart illustrating a method for finishing the exterior surface of an injection-molded product according to another embodiment of the present invention.
Figure 3:
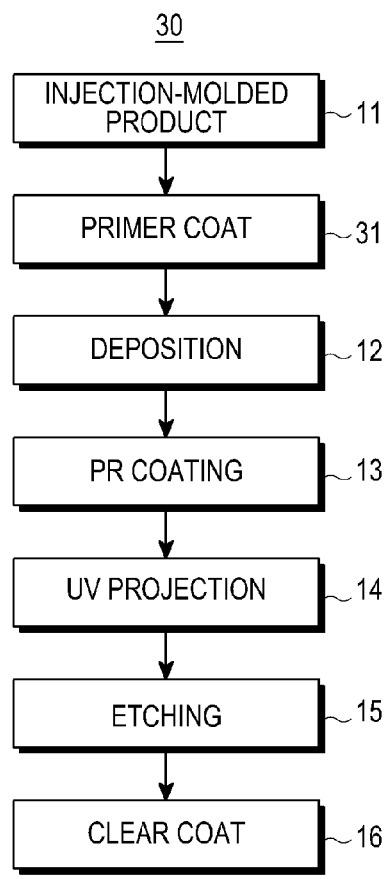
FIG. 3 is a flowchart illustrating a method for finishing the exterior surface of an injection-molded product according to yet another embodiment of the present invention.
Figure 4:
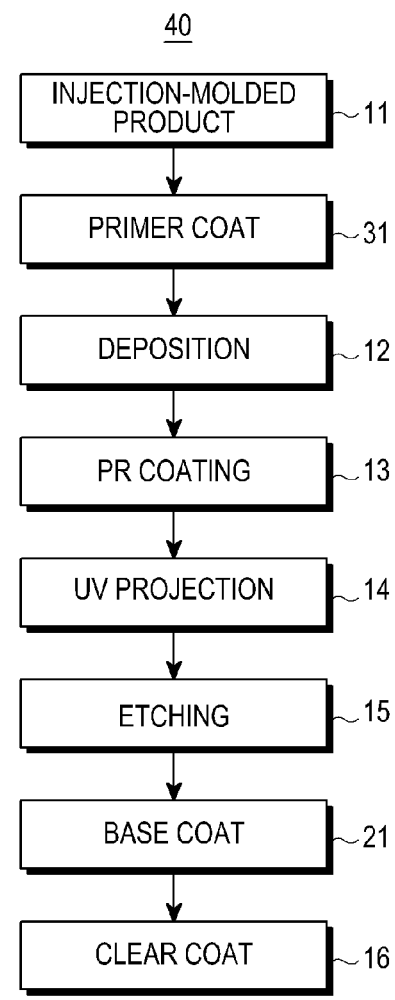
FIG. 4 is a flowchart illustrating a method for finishing the exterior surface of an injection-molded product according to a further embodiment of the present invention.

FIGS. 2, 3 and 4 illustrate methods for finishing the exterior surface of an injection-molded product according to other embodiments of the present invention. In these embodiments, step 31 for forming a primer layer and step 21 for forming a base coating layer are selectively added at various stages of the embodiment shown in FIG. 1.

Compared to the embodiment of the present invention illustrated in FIG. 1, step 21 is added to the embodiment illustrated in FIG. 2, step 31 is added to the embodiment illustrated in FIG. 3, and steps 21 and 31 are added to the embodiment illustrated in FIG. 4.

Step 31 precedes any other step for forming a layer on the surface of the injection-molded product 11. That is, the primer layer is formed on the exterior surface of the injection-molded product 11 before the metal layer 121 is formed. It will be clearly understood to those skilled in the art that the primer layer is formed to increase the affinity between pigment (or a coating solution) and the injection-molded product 11, when the exterior surface of the injection-molded product 11 is painted, for example, when the clear coating layer is formed on the exterior surface of the injection-molded product 11 as done in the embodiments of the present invention.

In step 21, the exterior surface of the injection-molded product 11 is coated with a base coat between the etching step 15 and the clear coating formation step 16. The final color of the exterior surface of the injection-molded product 11 is determined according to the color of the base coat.

As is apparent from the above description of the present invention, because a metal layer is deposited on the exterior surface of an injection-molded product and etched into an intended pattern, before clear coating, in forming a pattern or the logo of a manufacturer onto the exterior surface of the injection-molded product. As a result the appearance of the injection-molded product is visually sophisticated when compared to the conventional ink-based printing or film attachment method.

Although the invention has been described with reference to the preferred embodiments, those skilled in the art will appreciate that various modifications and variations can be made in the present invention without departing from the spirit or scope of the invention described in the appended claims.

What is claimed is:

1. A method for finishing an exterior surface of an injection-molded product, the method comprising:
    forming a primer layer over a part of the exterior surface of the injection-molded product;
    forming a metal layer over the primer layer;
    forming a photoresist layer on the metal layer;
    placing a photomask having a predetermined pattern on the photoresist layer;
    projecting light onto the photomask;
    etching to remove parts of the metal layer and the photoresist layer except for parts corresponding to the predetermined pattern formed on the photomask, the etching thereby exposing portions of the primer layer;
    forming a paint layer, the paint layer adhering only to the exposed portions of the primer layer; and
    forming a clear coating layer on the exterior surface of the injection-molded product after etching.

2. The method of claim 1, wherein forming the metal layer comprises depositing one of tin, silicon, aluminum and an alloy containing at least one of tin, silicon and aluminum on the exterior surface of the injection-molded product.

3. The method of claim 1, further comprising forming the paint layer on the exterior surface of the injection-molded product after the etching and before forming the clear coating layer.

4. The method of claim 1, wherein the etching comprises removing a light-exposed part or non-light-exposed part of the photoresist layer.

5. A method for finishing an exterior surface of an injection-molded product, the method comprising:
    forming a primer layer on a part of the exterior surface of the injection-molded product;
    forming a metal layer over the primer layer;
    forming a photoresist layer on the metal layer;
    placing a photomask having a predetermined pattern on the photoresist layer;
    projecting light onto the photomask;
    etching to remove parts of the metal layer and the photoresist layer except for parts corresponding to the predetermined pattern formed on the photomask, the etching thereby exposing portions of the primer layer; and
    forming a paint layer, the paint layer adhering only to the exposed portions of the primer layer.

6. The method of claim 5, wherein the predetermined pattern comprises at least one of, (a) a symbol and (b) a logo, of a manufacturer formed on the exterior surface of the injection-molded product and forming a clear coating layer on the exterior surface of the injection-molded product after the etching, the clear coating layer providing further polish to the exterior surface of the injection-molded product.

7. The method of claim 5, further comprising forming a clear coating layer on the exterior surface of the injection-molded product after the etching, the clear coating layer providing further polish to the exterior surface of the injection-molded product.

8. The method of claim 5, further comprising forming the paint layer on the exterior surface of the injection-molded product after the etching.

9. The method of claim 5, further comprising forming a clear coating layer on the exterior surface of the injection-molded product after the paint layer is formed.

* * * * *